US011211577B2

(12) United States Patent
Du

(10) Patent No.: US 11,211,577 B2
(45) Date of Patent: Dec. 28, 2021

(54) ORGANIC LIGHT EMITTING DIODE DEVICE, MANUFACTURING METHOD THEREOF, DISPLAY PANEL AND DISPLAY DEVICE

(71) Applicant: BOE Technology Group Co., Ltd., Beijing (CN)

(72) Inventor: Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 116 days.

(21) Appl. No.: 16/383,551

(22) Filed: Apr. 12, 2019

(65) Prior Publication Data

US 2020/0028109 A1 Jan. 23, 2020

(30) Foreign Application Priority Data

Jul. 19, 2018 (CN) ........................ 201810797987.2

(51) Int. Cl.
*H01J 1/62* (2006.01)
*H01L 51/52* (2006.01)
*H01L 51/50* (2006.01)

(52) U.S. Cl.
CPC ...... *H01L 51/5206* (2013.01); *H01L 51/5056* (2013.01); *H01L 51/5072* (2013.01); *H01L 51/5221* (2013.01)

(58) Field of Classification Search
None
See application file for complete search history.

(56) References Cited

U.S. PATENT DOCUMENTS

2009/0085474 A1* 4/2009 Shitagaki ............ H01L 51/5048 313/504
2017/0170420 A1* 6/2017 Ito ....................... H01L 51/0072
(Continued)

FOREIGN PATENT DOCUMENTS

CN 104241540 A 12/2014
CN 105304828 A 2/2016
(Continued)

OTHER PUBLICATIONS

Office Action issued in corresponding Chinese Patent Application No. 201810797987.2, dated Nov. 18, 2019.

*Primary Examiner* — Ali Naraghi
(74) *Attorney, Agent, or Firm* — McDermott Will & Emery LLP

(57) ABSTRACT

An organic light emitting diode device, a manufacturing method thereof, a display panel and a display device are disclosed. The organic light emitting diode device comprises an anode, a hole transport layer, an organic light emitting layer, an electron transport layer and a cathode, sequentially disposed in lamination, wherein the hole transport layer comprises N sub-hole transport layers, where N≥2, and a $(i+1)^{th}$ sub-hole transport layer is disposed on a side of a $i^{th}$ sub-hole transport layer away from the anode, the highest occupied molecular orbital (HOMO) energy level of a host material of the $i^{th}$ sub-hole transport layer being greater than the HOMO energy level of a host material of the $(i+1)^{th}$ sub-hole transport layer, where 1≤i≤N−1.

13 Claims, 3 Drawing Sheets

(56) References Cited

U.S. PATENT DOCUMENTS

| | | | | |
|---|---|---|---|---|
| 2018/0033993 | A1* | 2/2018 | Seo | H01L 51/0074 |
| 2018/0358562 | A1 | 12/2018 | Takita et al. | |
| 2018/0375029 | A1* | 12/2018 | Bealle | H01L 51/0058 |
| 2019/0006608 | A1* | 1/2019 | Koo | H01L 51/0087 |
| 2019/0081239 | A1* | 3/2019 | Fukagawa | H01L 51/5206 |

FOREIGN PATENT DOCUMENTS

| | | | |
|---|---|---|---|
| CN | 105514291 | A | 4/2016 |
| EP | 3 190 639 | A1 | 7/2017 |
| WO | 2017/103732 | A1 | 6/2017 |

* cited by examiner

ORGANIC LIGHT EMITTING DIODE DEVICE, MANUFACTURING METHOD THEREOF, DISPLAY PANEL AND DISPLAY DEVICE

CROSS REFERENCE TO RELATED APPLICATION

The present application claims a priority benefit of Chinese Patent Application No. 201810797987.2, filed on Jul. 20, 2018, the entirety of which is incorporated herein by reference.

TECHNICAL FIELD

The present disclosure relates to the technical field of display, and particularly to an organic light emitting diode device, a manufacturing method thereof, a display panel, and a display device.

BACKGROUND

As compared to liquid crystal displays (LCDs), organic light emitting diode (OLED) display devices have advantages of self-light emitting, rapid response, wide viewing angle, high luminance, bright colors, light weight and thin thickness, and the like, and have attracted more and more attention.

An OLED display device comprises an OLED device capable of converting electrical energy into optical energy in an organic material. Typically, an OLED device comprises an anode, a hole transport layer, a light emitting layer, an electron transport layer, and a cathode, and the luminescence principle thereof is that holes and electrons injected from the anode and the cathode respectively recombine in the light emitting layer to produce excitons, thereby achieving light emitting.

SUMMARY

Embodiments of the present disclosure provide an organic light emitting diode device, a manufacturing method thereof, a display panel, and a display device.

In one aspect, the embodiments of the present disclosure provide an organic light emitting diode device, comprising: an anode, a hole transport layer, and an organic light emitting layer, sequentially disposed in lamination, wherein the hole transport layer comprises N sub-hole transport layers, where N≥2, and a $(i+1)^{th}$ sub-hole transport layer is disposed on a side of a $i^{th}$ sub-hole transport layer away from the anode, and the highest occupied molecular orbital (HOMO) energy level of a host material of the $i^{th}$ sub-hole transport layer is greater than the HOMO energy level of a host material of the $(i+1)^{th}$ sub-hole transport layer, where $1 \le i \le N-1$.

Optionally, the organic light emitting diode device further comprises an electron transport layer and a cathode sequentially disposed in lamination on the organic light emitting layer.

Optionally, the organic light emitting diode device further comprises one or both of a hole injection layer or an electron injection layer, wherein the hole injection layer is disposed between the anode and a first hole transport layer, and the electron injection layer is disposed between the electron transport layer and the cathode.

Optionally, the organic light emitting diode device further comprises one or more layers of an electron blocking layer, a hole blocking layer or a light extraction layer, wherein the electron blocking layer is disposed between the $N^{th}$ sub-hole transport layer and the organic light emitting layer, the hole blocking layer is disposed between the organic light emitting layer and the electron transport layer, and the light extraction layer is disposed on a side of the cathode away from the anode.

Optionally, the HOMO energy level of the host material of the first sub-hole transport layer is greater than −5.4 electron volt (eV).

Optionally, the HOMO energy level of the host material of the $N^{th}$ sub-hole transport layer is less than −5.6 eV.

Optionally, a sum of thicknesses of the N sub-hole transport layers is from 1 to 400 nm.

Optionally, a host material of the anode comprises at least one of indium tin oxide or carbon nanotube.

Optionally, a host material of the sub-hole transport layers comprises at least one of a poly(para-phenylene-vinylene)-based, a polythiophene-based, a polysilane-based, a triphenylmethane-based, a triarylamine-based, a hydrazone-based, a pyrazoline-based, an oxazole-based, a carbazole-based, or a butadiene-based hole transport material.

Optionally, a host material of the organic light emitting layer comprises at least one of 4-(dicyanomethylene)-2-butyl-6-(1,1,7,7-tetramethyljulolidin-9-yl-vinyl)-4H-pyran (DCJTB), 9,10-di(β-naphthyl)anthracene (ADN), 4,4'-bis(9-ethyl-3-carbazovinylene)-1,1'-biphenyl (BCzVBi) or 8-hydroxyquinoline aluminum.

In another aspect, the embodiments of the present disclosure provide a method for manufacturing an organic light emitting diode device, comprising:

forming an anode;

forming a hole transport layer on the anode, wherein the hole transport layer comprises N sub-hole transport layers, where N≥2, and a $(i+1)^{th}$ sub-hole transport layer is disposed on a side of a $i^{th}$ sub-hole transport layer away from the anode, the HOMO energy level of a host material of the $i^{th}$ sub-hole transport layer is greater than the HOMO energy level of a host material of the $(i+1)^{th}$ sub-hole transport layer, where $1 \le i \le N-1$.

Optionally, the method further comprises forming an organic light emitting layer, an electron transport layer and a cathode sequentially on the $N^{th}$ sub-hole transport layer.

Optionally, said forming the hole transport layer on the anode comprises:

forming a hole injection layer on the anode; and forming N sub-hole injection layers sequentially on the hole injection layer.

Optionally, the N sub-hole transport layers are sequentially formed by an evaporation process or a solution process.

Optionally, said forming the organic light emitting layer, the electron transport layer and the cathode sequentially on the $N^{th}$ sub-hole transport layer comprises:

forming an electron blocking layer and an organic light emitting layer sequentially on the $N^{th}$ sub-hole transport layer; and forming a hole blocking layer, an electron transport layer, an electron injection layer and a cathode sequentially on the organic light emitting layer.

Optionally, after said forming the organic light emitting layer, the electron transport layer and the cathode sequentially on the $N^{th}$ sub-hole transport layer, the method further comprises:

forming a light extraction layer on the cathode.

Optionally, a host material of the anode is a transparent conductive material.

Optionally, a host material of the sub-hole transport layers comprises at least one of a poly(para-phenylene-vinylene)-based, a polythiophene-based, a polysilane-based, a triphenylmethane-based, a triarylamine-based, a hydrazone-based, a pyrazoline-based, an oxazole-based, a carbazole-based, or a butadiene-based hole transport material.

In another aspect, the embodiments of the present disclosure provide a display panel comprising the above organic light emitting diode device.

In still another aspect, the embodiments of the present disclosure also provide a display device comprising the above display panel.

BRIEF DESCRIPTION OF DRAWINGS

The drawings are used to provide further understandings of the technical solutions of the present disclosure, and form a part of the description. The drawings together with the embodiments of the present application are used to explain, but not to limit the technical solutions of the present disclosure.

DETAILED DESCRIPTION

In order to make the objects, technical solutions and advantages of the present disclosure more clear and apparent, the embodiments of the present disclosure will be described in detail below with reference to the drawings. It should be noted that, unless contradiction, the embodiments of the present application and the features in the embodiments can be combined with each other arbitrarily.

Steps in a flow chart as shown in a drawing may be executed in a computer system such as a group of computers capable of executing instructions. Although a logic sequence is shown in the flow chart, the steps as shown or described may be executed in a sequence different therefrom, in some cases.

Unless otherwise defined, the technical terms or scientific terms used in the embodiments of the present disclosure have usual meanings understood by a person of ordinary skills in the art. The words "first", "second" and the like used in the embodiments of the present disclosure do not indicate any order, number or importance, and are merely intended to distinguish different components. The word "comprise" or "include" or the like means the element or article present before this word encompasses the element or article listed after this word or an equivalent thereof, without excluding other element or article. The word "connect" or "link" or the like is not limited to a physical or mechanical connection, and may comprise an electrical connection, either directly or indirectly. The words "above", "below", "left", "right" and the like are only used to indicate relative position relationship. When the absolute position of the object referred to is changed, the relative position relationship may be changed accordingly.

The hole transport layer in existing OLED devices is prepared from a low HOMO energy level material. However, the inventors have discovered that although the use of a low HOMO energy level material can maintain the material stable during hole transport and significantly improve the lifetime of the device, the interface between the anode and the hole transport layer deteriorates during the operation of the OLED device because the HOMO energy level of the host material of the hole transport layer does not match with the HOMO energy level of the host material of the anode. Thus, the operating voltage of the OLED device significantly increases, and even exceeds the threshold voltage after a long term operation. This limits the use of a low HOMO energy level hole transport layer material in a product, and results in a short lifetime of the OLED device.

In order to solve the above technical problems, the embodiments of the present disclosure provide an organic light emitting diode device, a manufacturing method thereof, a display panel, and a display device. Detailed description is provided as follows.

Figure 1:
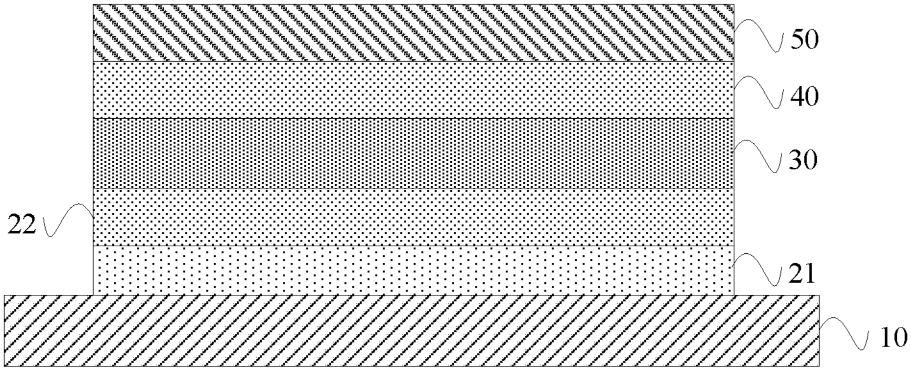
FIG. 1 is a schematic structural diagram of an OLED device provided in an embodiment of the present disclosure.

FIG. 1 is a schematic structural diagram of an OLED device provided in an embodiment of the present disclosure. As shown in FIG. 1, the OLED device provided in the embodiment of the present disclosure comprises an anode 10, a hole transport layer, an organic light emitting layer 30, an electron transport layer 40 and a cathode 50, sequentially disposed in lamination, wherein the hole transport layer comprises N sub-hole transport layers, N≥2.

Here, a $(i+1)^{th}$ sub-hole transport layer is disposed on a side of a $i^{th}$ sub-hole transport layer away from the anode 10, and the highest occupied molecular orbital (HOMO) energy level of a host material of the $i^{th}$ sub-hole transport layer is greater than the HOMO energy level of a host material of the $(i+1)^{th}$ sub-hole transport layer, wherein $1 \le i \le N-1$.

In particular, N sub-hole transport layers are sequentially disposed on the anode. The host material of the sub-hole transport layer closer to the anode has a higher HOMO energy level, and the host material of the sub-hole transport layer further away from the anode has a lower HOMO energy level. That is, the host material of the first sub-hole transport layer has the highest HOMO energy level, and the host material of the $N^{th}$ sub-hole transport layer has the lowest HOMO energy level.

Optionally, the number of the sub-hole transport layers included in the hole transport layer may be two or more, and may be particularly determined according to practical requirements. FIG. 1 illustrates an example in which the hole transport layer comprises two sub-hole transport layers, a first sub-hole transport layer 21 and a second sub-hole transport layer 22, but the embodiments of the present disclosure are not limited thereto. It should be noted that the larger the number of the sub-hole transport layers included, the more complex the manufacture procedure of the OLED device is and the higher the cost is.

Optionally, N is any integer between 2 to 10, for example, N may be 2, 3, 4 or 5.

Optionally, a host material of the sub-hole transport layers may be a poly(para-phenylene-vinylene)-based, a polythiophene-based, a polysilane-based, a triphenylmethane-based, a triarylamine-based, a hydrazone-based, a pyrazoline-based, an oxazole-based, a carbazole-based, or a butadiene-based material, or other similar material having hole transport property, and the embodiments of the present disclosure are not limited thereto. It should be noted that different host materials correspond to different HOMO energy levels. The host material of each sub-hole transport layer is not particularly limited in the embodiments of the present disclosure, as long as it can meet the condition that the HOMO energy level of the host material of $i^{th}$ sub-hole transport layer is greater than the HOMO energy level of the host material of $(i+1)^{th}$ sub-hole transport layer.

Optionally, the organic light emitting layer has a thickness of 5 to 40 nm, and the host material of the organic light emitting layer comprises 4-(dicyanomethylene)-2-butyl-6-(1,1,7,7-tetramethyljulolidin-9-yl-vinyl)-4H-pyran (DCJTB), 9,10-di(β-naphthyl)anthracene (ADN), 4,4'-bis(9-ethyl-3-carbazovinylene)-1,1'-biphenyl (BCzVBi) or 8-hydroxyquinoline aluminum.

Optionally, the electron transport layer has a thickness of 40 to 80 nm, and the host material of the electron transport layer comprises 4,7-diphenyl-1,10-phenanthroline (Bphen), 1,2,4-triazole derivative, or 1,3,5-tri(1-phenyl-1H-benzoimidazol-2-yl)benzene (TPBi). The material of the electron transport layer is an organic molecule material having a high electron mobility and capable of conducting electrons effectively.

Optionally, the cathode has a thickness of 60 to 300 nm, and the host material of the cathode comprises silver, aluminum, platinum or gold.

Optionally, the host material of the anode is a high work function material, and comprises a transparent conductive material, such as indium tin oxide (ITO) or carbon nanotube.

The organic light emitting diode device provided in the embodiment of the present disclosure comprises an anode, a hole transport layer, an organic light emitting layer, an electron transport layer and a cathode, sequentially disposed in lamination, wherein the hole transport layer comprises N sub-hole transport layers, N≥2, wherein a $(i+1)^{th}$ sub-hole transport layer is disposed on a side of a $i^{th}$ sub-hole transport layer away from the anode, and the HOMO energy level of a host material of the $i^{th}$ sub-hole transport layer is greater than the HOMO energy level of a host material of the $(i+1)^{th}$ sub-hole transport layer, wherein $1 \le i \le N-1$. In the technical solutions provided in the present disclosure, by disposing a sub-hole transport layer with a host material having a higher HOMO energy level on a side of a sub-hole transport layer with a host material having a lower HOMO energy level close to the anode, the HOMO energy level of the host material of the sub-hole transport layer close to the anode is allowed to match with the HOMO energy level of the host material of the anode, while the sub-hole transport layer with a host material having a lower HOMO energy level can maintain the material stability during the transport of holes into the organic light emitting layer, as a result, the deterioration of the interface between the hole transport layer and the anode during the operation of the OLED device is avoided, and the lifetime of the OLED device is improved, thereby satisfying the requirement of the lifetime of the OLED device for a display device.

Figure 2:
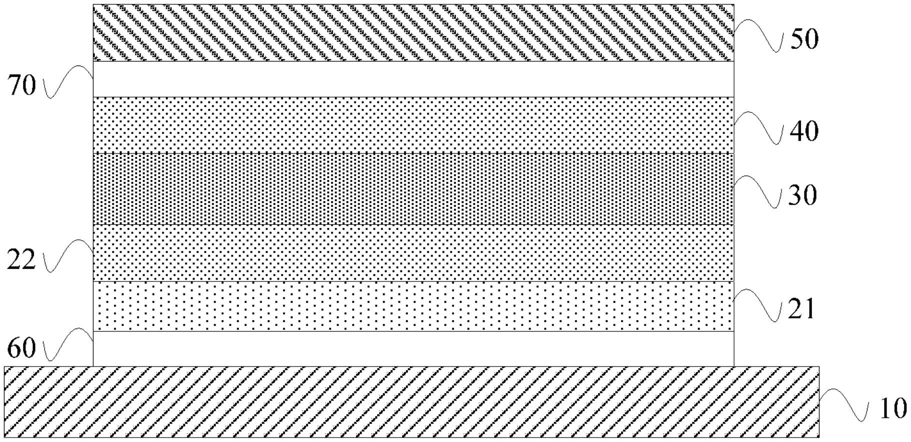
FIG. 2 is a schematic structural diagram of another OLED device provided in an embodiment of the present disclosure.

Optionally, FIG. 2 is a schematic structural diagram of another OLED device provided in an embodiment of the present disclosure. As shown in FIG. 2, the OLED device provided in the embodiment of the present disclosure further comprises a hole injection layer 60 and an electron injection layer 70.

Here, the hole injection layer 60 is disposed between the anode 10 and the first hole transport layer 21, and the electron injection layer 70 is disposed between the electron transport layer 40 and the cathode 50. It should be noted that FIG. 2 illustrates an example in which the hole transport layer comprises two sub-hole transport layers of the first sub-hole transport layer 21 and the second sub-hole transport layer 22.

Optionally, the hole injection layer has a thickness of 20 to 80 nm, and the host material of the hole injection layer comprises molybdenum trioxide, tungsten trioxide, or vanadium pentoxide.

Optionally, the electron injection layer has a thickness of 0.5 to 10 nm, and the host material of the electron injection layer comprises cesium carbonate, cesium fluoride, cesium azide, or lithium fluoride.

Figure 3:
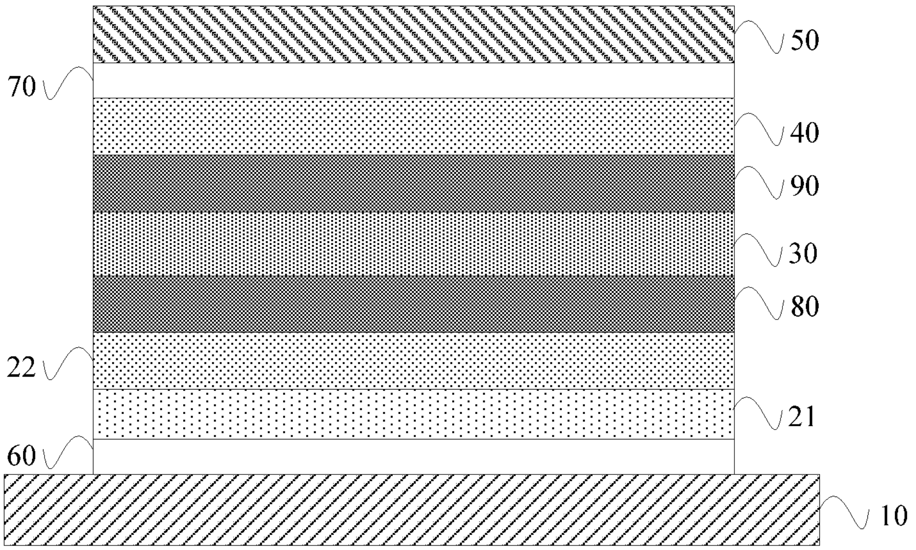
FIG. 3 is a schematic structural diagram of yet another OLED device provided in an embodiment of the present disclosure.

Optionally, FIG. 3 is a schematic structural diagram of yet another OLED device provided in an embodiment of the present disclosure. As shown in FIG. 3, the OLED device provided in the embodiment of the present disclosure further comprises an electron blocking layer 80 and a hole blocking layer 90.

Here, the electron blocking layer 80 is disposed between the $N^{th}$ sub-hole transport layer and the organic light emitting layer 30, and the hole blocking layer 90 is disposed between the organic light emitting layer 30 and the electron transport layer 40. It should be noted that FIG. 3 illustrates an example in which the hole transport layer comprises the first sub-hole transport layer 21 and the second sub-hole transport layer 22. That is, the electron blocking layer 80 is disposed between the second sub-hole transport layer 22 and the organic light emitting layer 30.

The OLED device provided in the embodiment of the present disclosure may further comprise a light extraction layer disposed on a side of the cathode away from the anode.

In the embodiments, by disposing the hole blocking layer, holes can be prevented from passing through the organic light emitting layer into the electron transport layer too rapidly, so that some of the holes remain in the organic light emitting layer to form excitons with electrons injected, thereby improving the luminescence efficiency of the OLED device.

Optionally, the host material of the hole blocking layer comprises 2,9-dimethyl-4,7-diphenyl-1,10-phenanthroline.

In the embodiments, by disposing the electron blocking layer, electrons can be prevented from passing through the organic light emitting layer into the hole transport layer too rapidly, so that some of the electrons remain in the organic light emitting layer to form excitons with holes injected, thereby improving the luminescence efficiency of the OLED device.

In addition, it should be noted that when selecting the electron transport layer, the energy band matching between the electron transport layer and the hole blocking layer should be taken into consideration, the difference in energy level between the two layers should be taken into full consideration, such that the hole-electron recombination region is maintained in the organic light emitting layer as much as possible.

Optionally, in order to ensure that the HOMO energy level of the host material of the hole transport layer well matches with the HOMO energy level of the host material of the anode, the HOMO energy level of the host material of the first sub-hole transport layer is greater than −5.4 eV.

Optionally, in order to maintain the material stability during the transport of holes into the organic light emitting layer, the HOMO energy level of the host material of the second sub-hole transport layer is less than −5.6 eV.

Optionally, a sum of thicknesses of the N sub-hole transport layers is 1 to 400 nm. The sum of thicknesses of the N sub-hole transport layers and the thickness of each sub-hole transport layer are not particularly limited in the embodiments of the present disclosure, and may be determined according to practical requirements. The thickness of each sub-hole transport layer may be the same as or different with each other, and may be 0.5 to 200 nm, with the provision that the sum of thicknesses of the N sub-hole transport layers is 1 to 400 nm.

In an example in which the hole transport layer comprises a first sub-hole transport layer and a second sub-hole transport layer, a sum of thicknesses of the first sub-hole transport layer and the second sub-hole transport layer is 1 to 400 nm.

The advantages of the OLED device provided in the embodiments of the present disclosure will be described below with reference to concrete experimental results.

Figure 4:
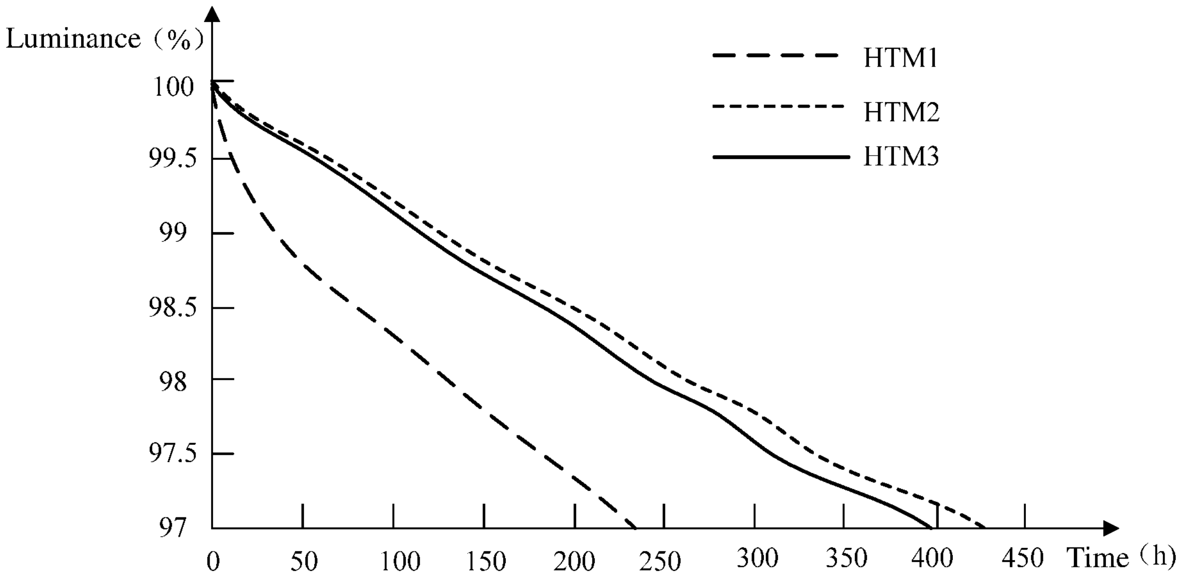
FIG. 4 shows the relationship between time and luminance for OLED devices.
Figure 5:
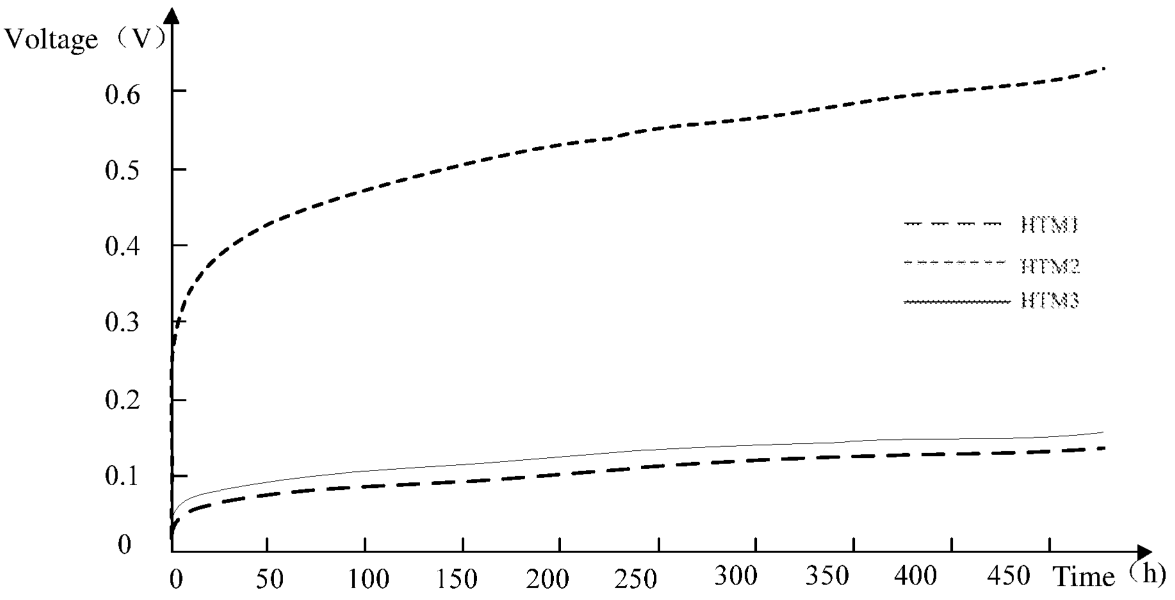
FIG. 5 shows the relationship between time and voltage for the OLED devices.

In particular, FIG. 4 shows the relationship between time and luminance for OLED devices, and FIG. 5 shows the relationship between time and voltage for the OLED devices. In FIGS. 4 and 5, HTM1 represents a hole transport layer with a thickness of 130 nm and with a host material having HOMO energy level greater than −5.4 eV, HTM2 represents a hole transport layer with a thickness of 130 nm and with a host material having HOMO energy level less than −5.6 eV, and HTM3 represents a hole transport layer comprising a first sub-hole transport layer with a thickness of 30 nm and with a host material having HOMO energy level greater than −5.4 eV and a second sub-hole transport layer with a thickness of 100 nm and with a host material having HOMO energy level less than −5.6 eV.

As shown in FIGS. 4 and 5, when HTM1 is used as the hole transport layer, the lifetime of the OLED device is 230 hours, and after 500 hours testing, the voltage of the OLED device only increases by 0.15 V. When HTM2 is used as the hole transport layer, the lifetime of the OLED device is 430 hours, that is, the lifetime of the OLED device is improved by a factor of about 2, but after 500 hours testing, the voltage of the device increases by greater than 0.6 V, so it cannot be used in products. However, when HTM3 is used as the hole transport layer, because the interface deterioration is avoided by using the first sub-hole transport layer with a host material having a higher HOMO energy level, and at the same time, the material stability during the transport of holes into the organic light emitting layer is maintained by using the second sub-hole transport layer with a host material having a lower HOMO energy level, the lifetime of the OLED device is 400 hours, which is similar to that when HTM2 is used as the hole transport layer, and after 500 hours testing, the voltage of the OLED device only increases by 0.17 V, completely meeting the requirements for products. Therefore, by using the present technology, the selection range of hole transport layer materials can be broadened, and the lifetime of OLED products can be significantly improved.

Figure 6:
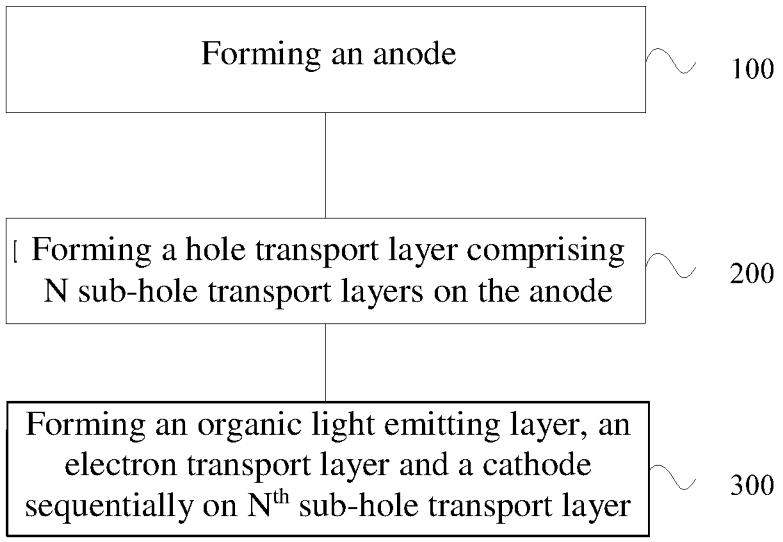
FIG. 6 is a flow chart of a method for manufacturing an OLED device provided in an embodiment of the present disclosure.

Based on the inventive concept of the above embodiments, FIG. 6 is a flow chart of a method for manufacturing an OLED device provided in an embodiment of the present disclosure. As shown in FIG. 6, the method for manufacturing an OLED device provided in the embodiment of the present disclosure comprises the following steps.

Step 100: Forming an anode.

In particular, Step 100 comprises forming an anode on a base substrate.

Optionally, the host material of the base substrate comprises a transparent material such as glass, plastic material, and the like, and this is not limited in any manner in the embodiments of the present disclosure.

Optionally, the host material of the anode is a high work function material, and comprises a transparent conductive material, such as indium tin oxide (ITO) or carbon nanotube.

Step 200: Forming a hole transport layer comprising N sub-hole transport layers on the anode.

Here, a $(i+1)^{th}$ sub-hole transport layer is disposed on a side of a $i^{th}$ sub-hole transport layer away from the anode, and the highest occupied molecular orbital (HOMO) energy level of a host material of the $i^{th}$ sub-hole transport layer is greater than the HOMO energy level of a host material of the $(i+1)^{th}$ sub-hole transport layer, wherein $1 \leq i \leq N-1$, and $N \geq 2$.

In particular, N sub-hole transport layers are sequentially disposed on the anode. The host material of the sub-hole transport layer closer to the anode has a higher HOMO energy level, and the host material of the sub-hole transport layer further away from the anode has a lower HOMO energy level. That is, the host material of the first sub-hole transport layer has the highest HOMO energy level, and the host material of the sub-hole transport layer has the lowest HOMO energy level.

Optionally, the number of the sub-hole transport layers included in the hole transport layer may be two or more, and may be particularly determined according to practical requirements.

Optionally, a host material of the sub-hole transport layers may be a poly(para-phenylene-vinylene)-based, a polythiophene-based, a polysilane-based, a triphenylmethane-based, a triarylamine-based, a hydrazone-based, a pyrazoline-based, an oxazole-based, a carbazole-based, a butadiene-based material, or other similar material having hole transport property, and the embodiments of the present disclosure are not limited thereto. It should be noted that different host materials correspond to different HOMO energy levels. The host material of each sub-hole transport layer is not particularly limited in the embodiments of the present disclosure, as long as it can meet the condition that the HOMO energy level of the host material of $i^{th}$ sub-hole transport layer is greater than the HOMO energy level of the host material of $(i+1)^{th}$ sub-hole transport layer.

In particular, Step 200 comprises forming a first sub-hole transport layer, a second sub-hole transport layer, . . . , and a $N^{th}$ sub-hole transport layer sequentially on the anode.

The N sub-hole transport layers may be formed by an evaporation process or a solution process. The process for forming the hole transport layer is not particularly limited in the embodiments of the present disclosure, and may be determined according to practical requirements.

Step 300: Forming an organic light emitting layer, an electron transport layer and a cathode sequentially on the $N^{th}$ sub-hole transport layer.

Optionally, the organic light emitting layer has a thickness of 5 to 40 nm, and the host material of the organic light emitting layer comprises 4-(dicyanomethylene)-2-butyl-6-(1,1,7,7-tetramethyljulolidin-9-yl-vinyl)-4H-pyran (DCJTB), 9,10-di(β-naphthyl)anthracene (ADN), 4,4'-bis(9-ethyl-3-carbazovinylene)-1,1'-biphenyl (BCzVBi) or 8-hydroxyquinoline aluminum.

Optionally, the electron transport layer has a thickness of 40 to 80 nm, and the host material of the electron transport layer comprises 4,7-diphenyl-1,10-phenanthroline (Bphen), 1,2,4-triazole derivative, or 1,3,5-tri(1-phenyl-1H-benzoimidazol-2-yl)benzene (TPBi). The material of the electron transport layer is an organic molecule material having a high electron mobility and capable of conducting electrons effectively.

Optionally, the cathode has a thickness of 60 to 300 nm, and the host material of the cathode comprises silver, aluminum, platinum or gold.

The method for manufacturing an organic light emitting diode device provided in the embodiments of the present disclosure may comprise: forming an anode; forming a hole transport layer on the anode, wherein the hole transport layer comprising N sub-hole transport layers, where N≥2; a $(i+1)^{th}$ sub-hole transport layer is disposed on a side of a $i^{th}$ sub-hole transport layer away from the anode, and the HOMO energy level of a host material of the $i^{th}$ sub-hole transport layer is greater than the HOMO energy level of a host material of the $(i+1)^{th}$ sub-hole transport layer, where 1≤i≤N−1; and forming an organic light emitting layer, an electron transport layer and a cathode sequentially on the $N^{th}$ sub-hole transport layer. In the technical solutions provided in the present disclosure, by disposing a sub-hole transport layer with a host material having a higher HOMO energy level on a side of a sub-hole transport layer with a host material having a lower HOMO energy level close to the anode, the HOMO energy level of the host material of the sub-hole transport layer close to the anode is allowed to match with the HOMO energy level of the host material of the anode, while the sub-hole transport layer with a host material having a lower HOMO energy level can maintain the material stability during the transport of holes into the organic light emitting layer, as a result, the deterioration of the interface between the hole transport layer and the anode during the operation of the OLED device is avoided, and the lifetime of the OLED device is improved, thereby satisfying the requirement of the lifetime of the OLED device for a display device.

Optionally, Step 200 may further comprise: forming a hole injection layer on the anode; and forming N sub-hole transport layers sequentially on the hole injection layer by an evaporation process or a solution process.

Optionally, the hole injection layer has a thickness of 20 to 80 nm, and the host material of the hole injection layer comprises molybdenum trioxide, tungsten trioxide, or vanadium pentoxide.

Optionally, Step 300 may further comprise: forming an electron blocking layer and an organic light emitting layer sequentially on the $N^{th}$ sub-hole transport layer; and forming a hole blocking layer, an electron transport layer, an electron injection layer and a cathode on the organic light emitting layer.

Optionally, the electron injection layer has a thickness of 0.5 to 10 nm, and the host material of the electron injection layer comprises cesium carbonate, cesium fluoride, cesium azide, or lithium fluoride.

In the embodiments, by disposing the hole blocking layer, holes can be prevented from passing through the organic light emitting layer into the electron transport layer too rapidly, so that some of the holes remain in the organic light emitting layer to form excitons with electrons injected, thereby improving the luminescence efficiency of the OLED device.

Optionally, the host material of the hole blocking layer comprises 2,9-dimethyl-4,7-diphenyl-1,10-phenanthroline.

In the embodiments, by disposing the electron blocking layer, electrons can be prevented from passing through the organic light emitting layer into the hole transport layer too rapidly, so that some of the electrons remain in the organic light emitting layer to form excitons with holes injected, thereby improving the luminescence efficiency of the OLED device.

In addition, it should be noted that when selecting the electron transport layer, the energy band matching between the electron transport layer and the hole blocking layer should be taken into consideration, the difference in energy level between the two layers should be taken into full consideration, such that the hole-electron recombination region is maintained in the organic light emitting layer as much as possible.

Optionally, in the method for preparing an OLED device provided in the embodiments of the present disclosure, after Step 300, the method further comprises forming a light extraction layer on the cathode.

Based on the inventive concept of the above embodiments, the embodiments of the present disclosure also provide a display panel comprising: an OLED device.

Here, the OLED device is the OLED device provided in the embodiments of the present disclosure, and has a similar implementation principle and effects, which will not be reiterated here.

Based on the inventive concept of the above embodiments, the embodiment of the present disclosure also provides a display device comprising the above display panel.

It should be noted that the display device may be any product or component having a displaying function such as mobile phone, tablet computer, television, display, laptop, digital photo frame, navigator and the like, and this is not limited in the embodiments of the present disclosure.

The drawings for the embodiments of the present disclosure only relate to the structures involved in the embodiments of the present disclosure, and reference can be made to usual designs for other structures.

For clarity, in the drawings for describing the embodiments of the present disclosure, the thickness and size of a layer or a microstructure are enlarged. It should be understood that when an element such as a layer, a film, an area or a substrate is referred to as being positioned "above" or "below" another element, the element may be directly positioned "above" or "below" the another element, or there may be an intermediate element.

Unless contradiction, the embodiments of the present disclosure and the features in the embodiments can be combined with each other to obtain a new embodiment.

Although the embodiments of the present disclosure are illustrated as above, the contents described are only for the convenience of understanding the present invention, but not intended to limit the present invention. One skilled in the art can make any modification or change on the forms and details of the embodiments without departing from the spirit and scope of the present disclosure. The protection scope of the present invention is defined by the following claims.

What is claimed is:

1. An organic light emitting diode device, comprising: an anode, a hole injection layer, a hole transport layer, and an organic light emitting layer, sequentially disposed in lamination, wherein, the hole transport layer comprises N sub-hole transport layers, where N=2, and the hole injection layer is disposed between the anode and the first hole transport layer, a (i+1)th sub-hole transport layer is disposed on a side of a ith sub-hole transport layer away from the anode, and the highest occupied molecular orbital (HOMO) energy level of a host material of the ith sub-hole transport layer is greater than the HOMO energy level of a host material of the (i+1)th sub-hole transport layer, where 1 of the host material of a first sub-hole transport layer is greater than −5.4 eV, and the HOMO energy level of the host material of the Nth sub-hole transport layer is less than −5.6 eV, wherein a host material of the anode is carbon nanotube, wherein a host material of the hole injection layer comprises molybdenum trioxide, tungsten trioxide, or vanadium pentoxide, wherein a host material of the N sub-hole transport layers comprises at least one of a poly(para-phenylene-vinylene)-based, wherein a host material of the sub-hole transport layers comprises at least one of a poly(para-phenylene-vinylene)-based, a polysilane-based, a triphenylmethane-based, a hydrazone-based, a pyrazoline-based, an oxazole-based, or a butadiene-based hole transport material, and wherein a host material of the organic light emitting layer comprises at least one of 4-(dicyanomethylene)-2-butyl-6-(1,1,7,7-tetramethyljulolidin-9-yl-vinyl)-4H-pyran (DCJTB), 9,10-di(B-naphthyl)anthracene (ADN), 4,4'-bis (9-ethyl-3-carbazovinylene)-1,1'-biphenyl (BCzVBi) or 8-hydroxyquinoline aluminum.

2. The organic light emitting diode device according to claim 1, further comprising an electron transport layer and a cathode sequentially disposed in lamination on the organic light emitting layer.

3. The organic light emitting diode device according to claim 2, wherein the electron injection layer is disposed between the electron transport layer and the cathode.

4. The organic light emitting diode device according to claim 2, further comprising one or more layers of an electron blocking layer, a hole blocking layer or a light extraction layer, wherein the electron blocking layer is disposed between the $N^{th}$ sub-hole transport layer and the organic light emitting layer, the hole blocking layer is disposed between the organic light emitting layer and the electron transport layer, and the light extraction layer is disposed on a side of the cathode away from the anode.

5. The organic light emitting diode device according to claim 1, wherein a sum of thicknesses of the N sub-hole transport layers is from 1 to 400 nm.

6. The organic light emitting diode device according to claim 1, wherein a host material of the organic light emitting layer comprises at least one of 4-(dicyanomethylene)-2-butyl-6-(1,1,7,7-tetramethyljulolidin-9-yl-vinyl)-4H-pyran (DCJTB), 9,10-di((β-naphthyl)anthracene (ADN), 4,4'-bis (9-ethyl-3-carbazovinylene)-1,1'-biphenyl (BCzVBi) or 8-hydroxyquinoline aluminum.

7. A display panel comprising the organic light emitting diode device according to claim 1.

8. A display device comprising the display panel according to claim 7.

9. A method for manufacturing an organic light emitting diode device, comprising: forming an anode; forming a hole injection layer on the anode; and forming a hole transport layer on the hole injection layer wherein the hole transport layer comprises N sub-hole transport layers, where N>2, and a (i+1)th sub-hole transport layer is disposed on a side of a ith sub-hole transport layer away from the anode, and the highest occupied molecular orbital (HOMO) energy level of a host material of the ith sub-hole transport layer is greater than the HOMO energy level of a host material of the (i+1)th sub-hole transport layer, where 1 sub-hole transport layer is greater than −5.4 eV, and the HOMO energy level of the host material of the Nth sub-hole transport layer is less than −5.6 eV, and forming an organic light emitting layer on the Nth sub-hole transport layer, wherein a host material of the anode is carbon nanotube, wherein a host material of the hole injection layer comprises molybdenum trioxide, tungsten trioxide, or vanadium pentoxide, wherein a host material of the N sub-hole transport layers comprises at least one of a poly(para-phenylene-vinylene)-based, a polysilane-based, a triphenylmethane-based, a polysilane-based, a triphenylmethane-based, r a butadiene-based hole transport material, and wherein a host material of the organic light emitting layer comprises at least one of 4-(dicyanomethylene)-2-butyl-6-(1,1,7,7-tetramethyljulolidin-9-yl-vinyl)-4H-pyran (DCJTB), 9,10-di(B-naphthyl)anthracene (ADN), 4,4'-bis(9-ethyl-3-carbazovinylene)-1,1'-biphenyl (BCzVBi) or 8-hydroxyquinoline aluminum.

10. The method according to claim 9, wherein the method further comprises forming an electron transport layer and a cathode sequentially on the organic light emitting layer.

11. The method according to claim 10, wherein, the method further comprises:

forming a light extraction layer on the cathode.

12. The method according to claim 9, wherein the N sub-hole transport layers are sequentially formed by an evaporation process or a solution process.

13. The method according to claim 9, wherein a host material of the anode is a transparent conductive material.

* * * * *